(12) United States Patent
Huang et al.

(10) Patent No.: US 7,819,174 B2
(45) Date of Patent: Oct. 26, 2010

(54) HEAT PIPE COOLING SYSTEM AND THERMAL CONNECTOR THEREOF

(75) Inventors: Bin-Juine Huang, Taipei (TW);
Chih-Hung Wang, Taipei County (TW);
Huan-Hsiang Huang, Taipei County
(TW); Yu-Yuan Yeh, Taichung County
(TW)

(73) Assignee: Advanced Thermal Device Inc., Taipei
(TW)

( * ) Notice: Subject to any disclaimer, the term of this
patent is extended or adjusted under 35
U.S.C. 154(b) by 423 days.

(21) Appl. No.: 11/307,685

(22) Filed: Feb. 17, 2006

(65) Prior Publication Data

US 2006/0185827 A1   Aug. 24, 2006

(30) Foreign Application Priority Data

Feb. 18, 2005   (CN)   ................... 2005 1 0007414

(51) Int. Cl.
*F28F 7/00*   (2006.01)
*H05K 7/20*   (2006.01)
*F28D 15/00*   (2006.01)
*F25B 21/02*   (2006.01)

(52) U.S. Cl. ................. 165/80.4; 165/104.25; 361/699; 62/3.7

(58) Field of Classification Search ................. 165/80.4, 165/104.25; 361/699; 62/3.7
See application file for complete search history.

(56) References Cited

U.S. PATENT DOCUMENTS 2,819,883 A * 1/1958 Rieppel et al. ............. 165/178
4,072,188 A * 2/1978 Wilson et al. ............. 165/80.4
4,085,728 A * 4/1978 Tomchak .................... 126/669
5,239,200 A * 8/1993 Messina et al. ............ 257/714
5,787,976 A * 8/1998 Hamburgen et al. ........ 165/185
6,082,443 A * 7/2000 Yamamoto et al. ...... 165/104.26
6,166,907 A * 12/2000 Chien ........................ 361/699
6,234,240 B1 * 5/2001 Cheon ....................... 165/80.3
6,477,045 B1 * 11/2002 Wang ........................ 361/700
6,600,649 B1 * 7/2003 Tsai et al. ................... 361/697
6,725,682 B2 * 4/2004 Scott ........................ 62/259.2
6,880,346 B1 * 4/2005 Tseng et al. ................. 62/3.7

(Continued)

FOREIGN PATENT DOCUMENTS

GB      2167905 A   *  6/1986
JP      03141663 A   *  6/1991
WO   WO2004031675        4/2004

*Primary Examiner*—Cheryl J Tyler
*Assistant Examiner*—Brandon M Rosati
(74) *Attorney, Agent, or Firm*—Jianq Chyun IP Office

(57) ABSTRACT

A heat pipe cooling system including an evaporator, a pipeline, a working fluid and a thermal connector is provided. The evaporator is connected to a heat-generating element, and the pipeline is connected to the evaporator. The working fluid is injected into a closed loop formed by the evaporator and the pipeline. The thermal connector includes a first thermal conductive block and a second thermal conductive block. The first thermal conductive block has many first fitting parts and a contact surface. The contact surface is suitable for attaching to one of the surfaces of an object. The second thermal conductive block has many second fitting parts. The second fitting parts are suitable for meshing with the first fitting parts to form a piping channel inside the thermal connector. The piping channel is suitable for enclosing a section of the pipeline or directly serving as a part of the pipeline.

12 Claims, 13 Drawing Sheets

U.S. PATENT DOCUMENTS

| | | | |
|---|---|---|---|
| 6,938,685 B2 * | 9/2005 | Duerr et al. | 165/148 |
| 7,013,956 B2 * | 3/2006 | Thayer et al. | 165/104.25 |
| 7,316,263 B2 * | 1/2008 | Lofland et al. | 165/80.4 |
| 2001/0008071 A1 * | 7/2001 | Macias et al. | 62/3.7 |
| 2002/0056542 A1 | 5/2002 | Yamamoto et al. | |
| 2004/0069459 A1 * | 4/2004 | Tonosaki et al. | 165/104.25 |
| 2007/0199679 A1 * | 8/2007 | Hwang et al. | 165/80.4 |
| 2007/0227697 A1 * | 10/2007 | Takahashi | 165/80.4 |

* cited by examiner

HEAT PIPE COOLING SYSTEM AND THERMAL CONNECTOR THEREOF

CROSS-REFERENCE TO RELATED APPLICATION

This application claims the priority benefit of People's Republic of China application serial no. 200510007414.8, filed on Feb. 18, 2005. All disclosure of the People's Republic of China application is incorporated herein by reference.

BACKGROUND OF THE INVENTION

1. Field of the Invention

The present invention relates to a cooling system and its cooling elements. More particularly, the present invention relates to a heat pipe cooling system and a thermal connector thereof.

2. Description of the Related Art

To remove the heat produced by a heat-generating device in operation and prevent over-heating due to the rapid accumulation of heat around the heat-generating device, a heat sink is often attached to the surface of the heat-generating device. Furthermore, a fan is also used to force a stream of air over the heat sink and produce a convective current that carries the heat away from the heat sink and prevents the over-heating of the device.

However, as the quantity of heat generated by the device is increased, the conventional heat dissipation method will become a bottleneck. To match the increase in heat production by a heat-generating device so that the device can operate within a normal operating temperature range, the conventional technique demands an increase in the total surface area of cooling fins on the heat sink or the rotational speed of the fan. Yet, if the heat-generating device is disposed inside the limited space of an enclosed housing, then increasing the surface area of fins will increase the spatial occupation of the cooling fins. On the other hand, if the rotational speed of the fan is increased to provide a more forceful convection, more vibration and noise will be produced in addition to an increase in energy consumption.

In recent years, a thermal device that conducts heat away through the phase change in a working fluid has been developed. These phase-change thermal devices include two major types: the loop heat pipe and the capillary pump loop, for example. To carry heat away from a heat-generating device, the working fluid in an evaporator absorbs the heat and changes into a gaseous phase. A capillary structure separates the liquid working fluid and the gaseous working fluid. A sufficiently powerful pressure differential is established between the inside and outside of the capillary structure. Then, the pressure differential drives the working fluid to recycle in the loop system. In the recycling process, the heat absorbed by the gaseous working fluid is released inside a condenser so that the working fluid returns to a liquid phase. Because the capillary structure inside the thermal device can produce a sufficiently large capillary force to resist the friction of the working fluid flowing inside the thermal device, the phase-change thermal device is able to carry heat away from a heat source over a long distance to a condenser.

For example, when a central processing unit (CPU) is disposed inside a limited space within a computer casing, the phase-change thermal device can carry the heat produced by the CPU through a pipeline to a suitable location where heat can be dissipated. Thus, the heat-dissipating device is no longer constrained by the limited space inside the computer casing. Other advantage of the heat pipe cooling system includes a sturdy package, a high thermal conductive capacity, a flexible pipeline routing, a power source free operation and an operation unaffected by gravity.

SUMMARY OF THE INVENTION

Accordingly, at least one objective of the present invention is to provide a thermal connector for linking the pipeline of a heat pipe cooling system to an object and using the object as a condenser for the heat pipe cooling system.

At least a second objective of the present invention is to provide a heat pipe cooling system for transferring the heat from a heat-generating device to an object and using the object as a condenser of the heat pipe cooling system to remove the heat.

To achieve these and other advantages and in accordance with the purpose of the invention, as embodied and broadly described herein, the invention provides a thermal connector. The thermal connector comprises a first thermal conductive block and a second thermal conductive block. The first thermal conductive block has a plurality of first fitting parts and a contact surface. The contact surface is attached to one of the surfaces of an object. The second thermal conductive block has a plurality of second fitting parts suitable for meshing with the first fitting parts. When the second fitting parts mesh with the first fitting parts, the first thermal conductive block and the second thermal conductive block together form a piping channel inside the thermal connector suitable for enclosing a section of the pipeline or directly serving as a part of the pipeline.

According to the preferred embodiment of the present invention, each first fitting part of the thermal connector is a spine and a corresponding second fitting part of the thermal connector is a groove.

According to the preferred embodiment of the present invention, each first fitting part of the thermal connector is a groove and a corresponding second fitting part of the thermal connector is a spine.

According to the preferred embodiment of the present invention, the piping channel meanders inside the interior of the thermal connector after assembling the first thermal conductive block and the second thermal conductive block together.

According to the preferred embodiment of the present invention, the seams on the surface after assembling the first thermal conductive block and the second thermal conductive block together are sealed using a soldering material.

According to the preferred embodiment of the present invention, each first fitting part is tightly fitted into a corresponding second fitting part.

According to the preferred embodiment of the present invention, the piping channel tightly encloses the connecting pipeline when the piping channel accommodates a section of the connecting pipeline.

According to the preferred embodiment of the present invention, the thermal connector after assembling the first thermal conductive block and the second thermal conductive block together can be detachably connected to the object such that the contact surface is attached to the surface of the object.

According to the preferred embodiment of the present invention, the thermal connector after assembling the first thermal conductive block and the second thermal conductive block together can be mounted onto the object using a set of screws. The screws tighten the two together so that the contact surface of the thermal connector is attached to the surface of the object.

According to the preferred embodiment of the present invention, the thermal connector after assembling the first thermal conductive block and the second thermal conductive block together is attached to the object through magnetic force of attraction so that the contact surface is attached to the surface of the object.

The present invention also provides a heat pipe cooling system comprising an evaporator, a connecting pipeline, a working fluid and the aforementioned thermal connector. The evaporator is connected to the heat-generating device. The connecting pipeline is linked to the evaporator. The working fluid is injected into a closed loop formed by the evaporator and the pipeline.

According to the preferred embodiment of the present invention, the heat pipe cooling system further comprises a cooling module connected to the evaporator, and the cooling module comprises a plurality of cooling fins coupling to thermal connector and a fan mounted on the fins.

In the present invention, the heat from a heat source is transferred to an object attached to the thermal conductive block through the connecting pipeline of a heat pipe cooling system. Then, the heat is dissipated from the surface of the object in a natural or forced convection. Thus, the heat produced by a heat-generating device can be removed through the heat pipe cooling system of the present invention with a very low energy budget.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
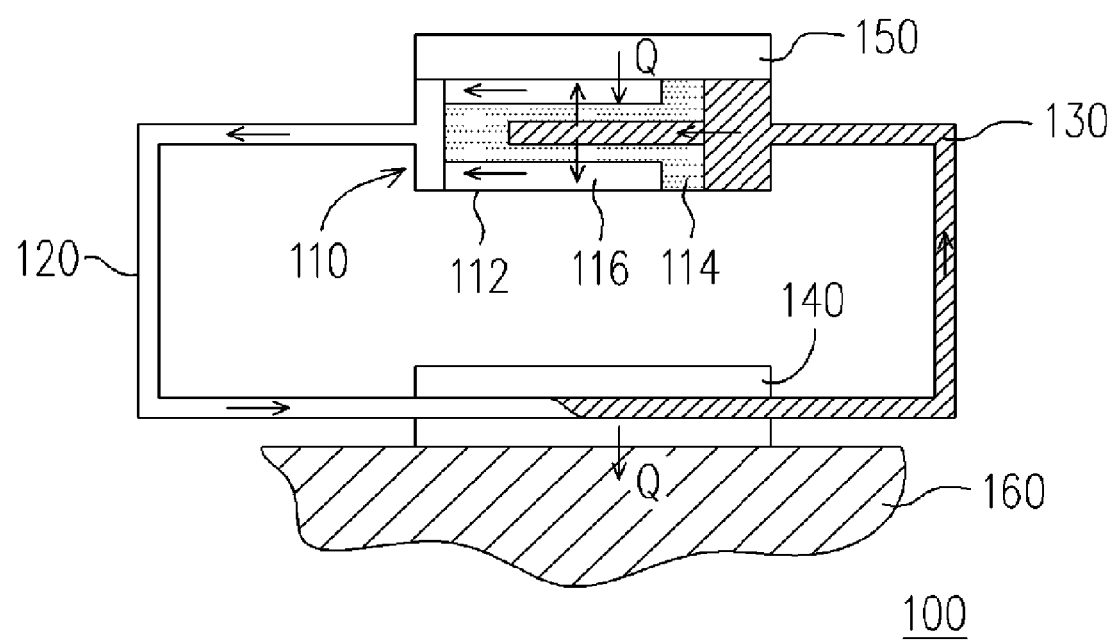
FIG. 1 is a schematic cross-sectional view of a heat pipe cooling system according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a heat pipe cooling system according to one embodiment of the present invention. As shown in FIG. 1, the heat pipe cooling system 100 mainly comprises an evaporator 110, a connecting pipeline 120, a working fluid 130 and a thermal connector 140. A heat-generating device 150 is attached to the evaporator 110 and the connecting pipeline 120 is linked to the evaporator 110. The working fluid 130 is injected into the closed loop formed by the evaporator 110 and the connecting pipeline 120. The evaporator 110 further comprises an evaporation wall 112, a wick structure 114 and a vaporizing groove 116. The wick structure 114 is disposed inside the evaporation wall 112 and the plurality of vaporizing grooves 116 is disposed between the evaporation wall 112 and the wick structure 114.

When a quantity of heat Q produced by the heat-generating device 150 is conducted to the evaporator 110, the heat Q passes through the evaporation wall 112 into the wick structure 114. The liquid phase working fluid 130 soaked up by the wick structure 114 absorbs the heat Q and vaporizes into a gaseous working fluid 130. Then, the gaseous working fluid 130 flows along the vaporizing groove 116 and the connecting pipeline 120 to the thermal connector 140 where the heat Q is dissipated. As the gaseous working fluid 130 releases the heat Q in the thermal connector 140, the gaseous working fluid 130 also condenses back to a liquid state and returns to the wick structure 114 inside the evaporator 110 along the connecting pipeline 120 to complete a cycle.

Note that the main concept behind the present invention is that the thermal connector 140 is designed to attach to an object 160 that serves as a condenser of the heat pipe cooling system 100. The heat transferred to the object 160 is then removed by natural or forced convection. The object 160 can be a metal casing or any material suitable for exchanging heat with the environment, for example. In the following, the structure of the thermal connector 140 and the applications of the heat pipe cooling system 100 are described in more detail.

Figure 2:
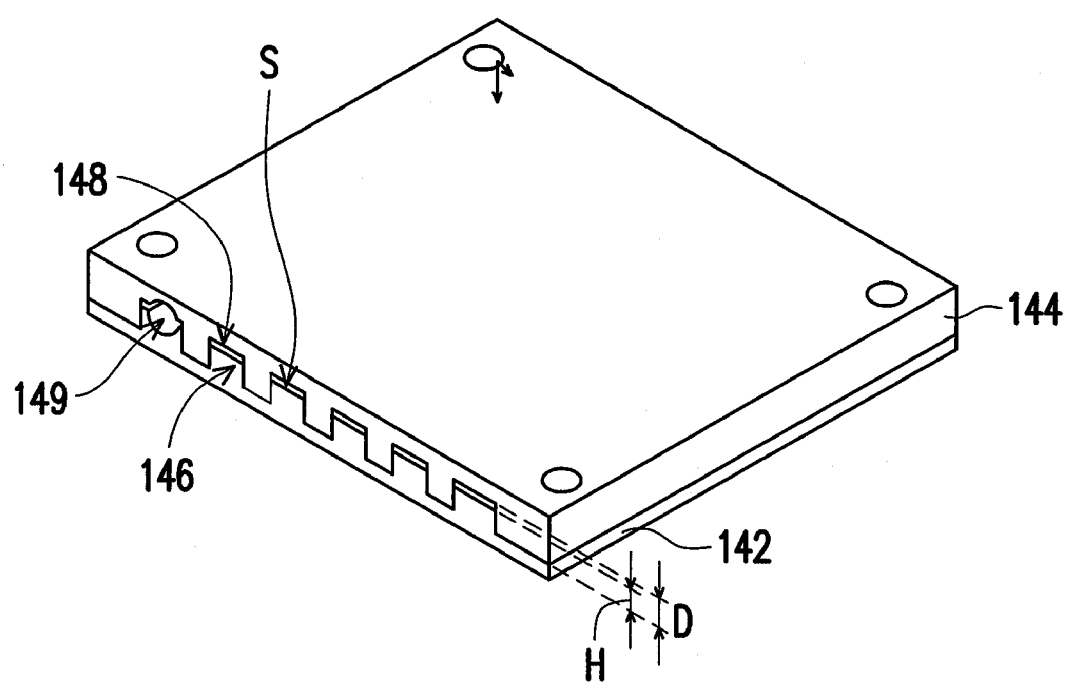
FIG. 2 is a perspective view of the thermal connector in FIG. 1.
Figure 3:
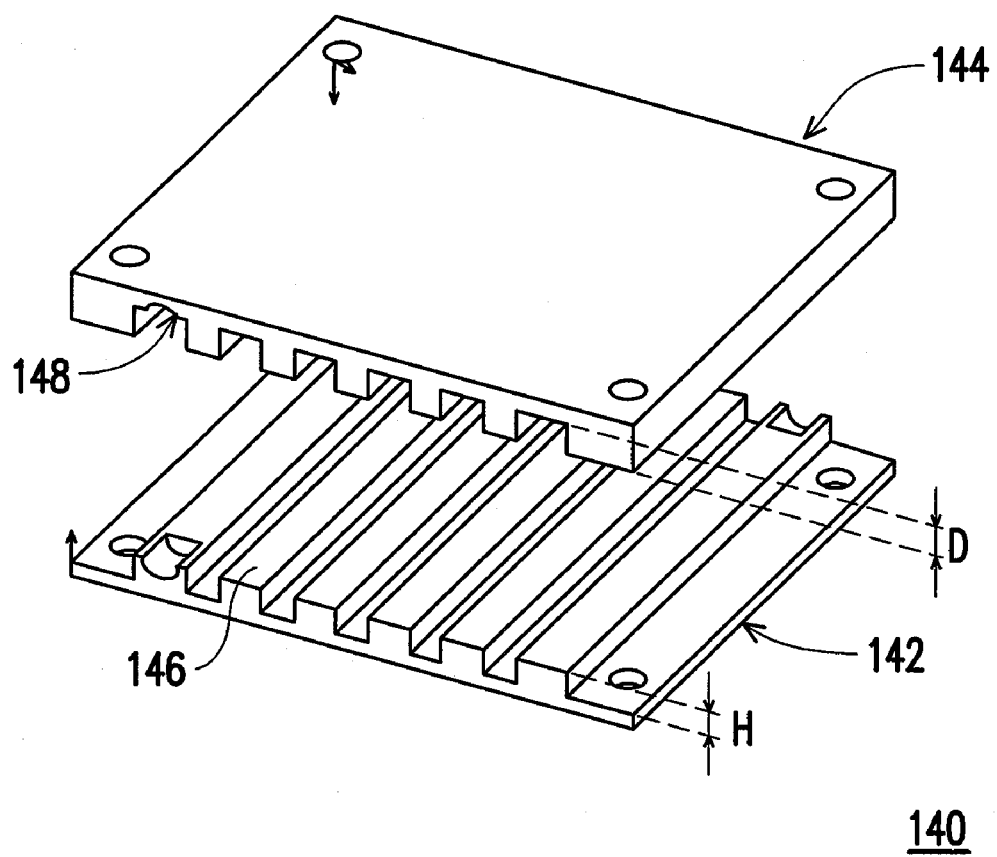
FIG. 3 is an explosion view of the components of the thermal connector in FIG. 2.
Figure 4:
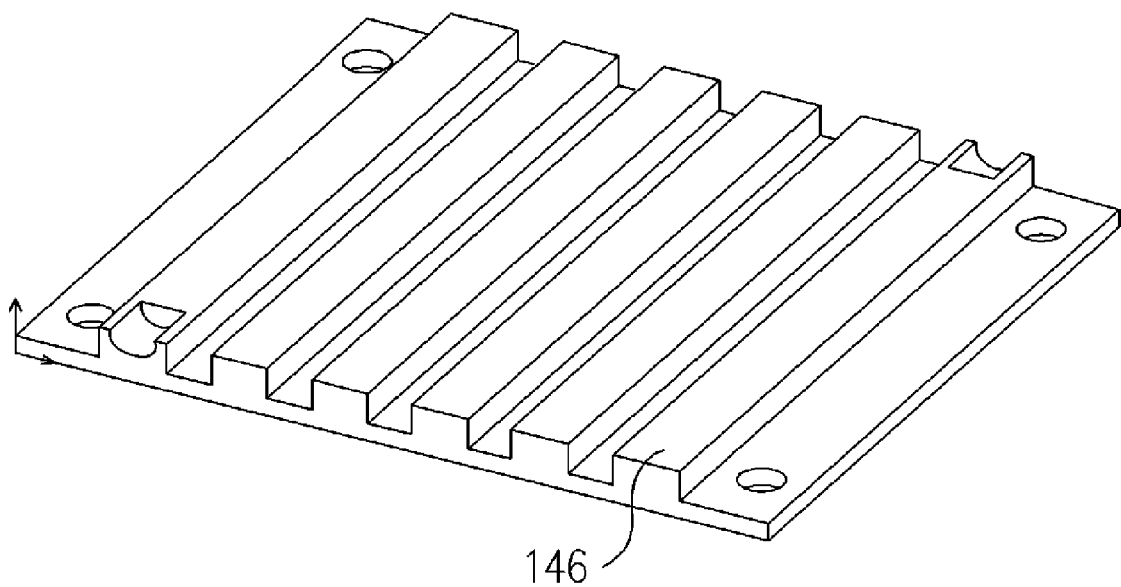
FIG. 4 is a perspective view of the first thermal conductive block in FIG. 3.
Figure 5:
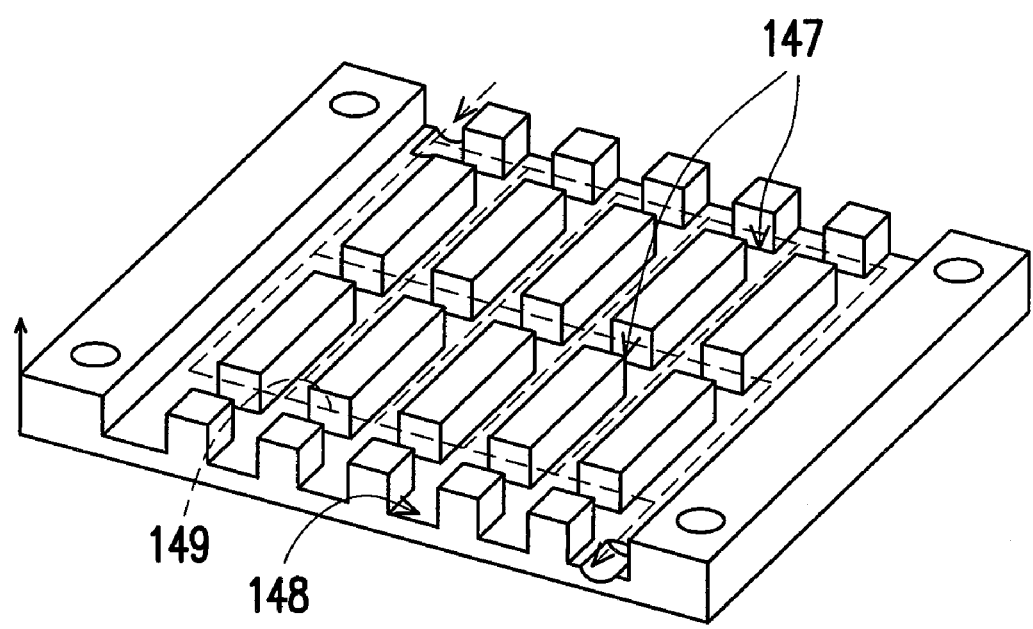
FIG. 5 is a perspective view of the second thermal conductive block in FIG. 3.

FIG. 2 is a perspective view of the thermal connector in FIG. 1. FIG. 3 is an explosion view of the components of the thermal connector in FIG. 2. FIG. 4 is a perspective view of the first thermal conductive block in FIG. 3. FIG. 5 is a perspective view of the second thermal conductive block in FIG. 3. As shown in FIGS. 1 to 5, the thermal connector 140 mainly comprises a first thermal conductive block 142 and a second thermal conductive block 144. The first thermal conductive block 142 has a plurality of first fitting parts 146 and each first fitting part 146 is a spine (see FIG. 4), for example. The second thermal conductive block 144 has a plurality of second fitting parts 148 with each second fitting part corresponding to a first fitting part 146. Furthermore, the second fitting parts 148 are grooves (see FIG. 5), for example. At least two adjacent grooves communicate with each other through a plurality of trenches 147 passing across the at least two adjacent grooves. The depth D of each of the grooves is greater than the height H of each of the spines. Each of the grooves and the corresponding spine form a space S (as shown in FIG. 2) between the top of the spine and the bottom of the groove. Obviously, in another embodiment, the first fitting parts 146 can be grooves and the second fitting parts 148 can be spines. When the first thermal conductive block 142 and the second thermal conductive block 144 are assembled together, a piping channel 149 is formed inside the thermal connector 140, and the trenches 147 and the spaces S form the piping channel 149. Hence, the working fluid 130 can flow in the piping channel 149. In addition, the first thermal conductive block 142 and the second thermal conductive block 144 can be joined together by applying soldering material to seal the gaps between the two blocks so that the working fluid 130 is prevented from leaking out through the gaps between the two thermal conductive blocks 142 and 144.

Figure 6:
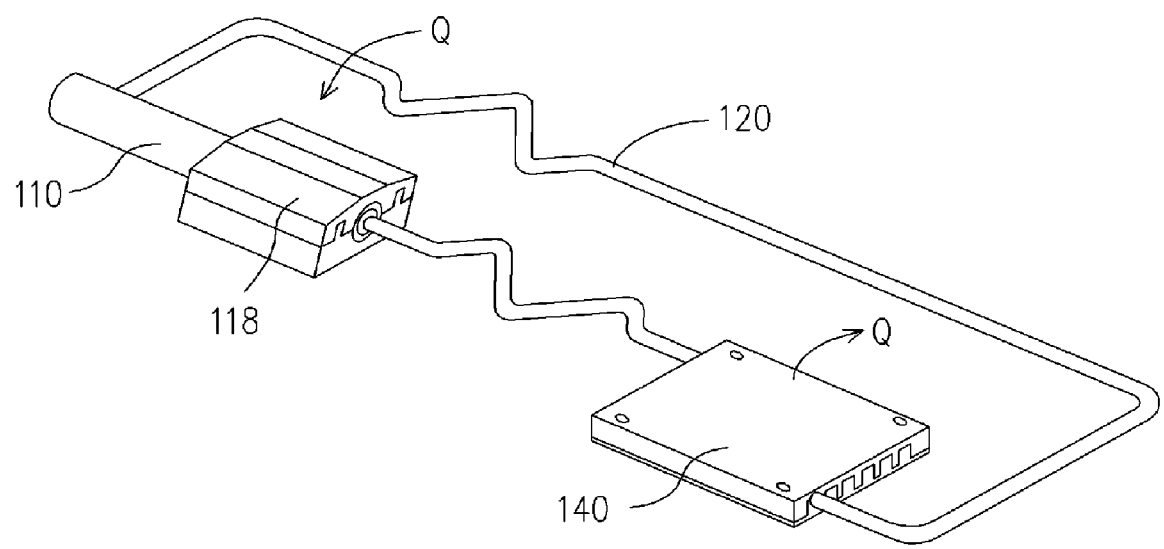
FIG. 6 is a rough sketch showing the external appearance of the heat pipe cooling system in FIG. 1.

FIG. 6 is a rough sketch showing the external appearance of the heat pipe cooling system in FIG. 1. As shown in FIGS. 5 and 6, when the thermal connector 140 and the connecting pipeline 120 are joined together, the piping channel 149 shown in FIG. 5 can serve as a part of the connecting pipeline 120. Hence, when the gaseous working fluid 130 moves into the thermal connector 140, the heat within the gaseous working fluid 130 can be directly transferred to the object 160 via the thermal connector 140 (see FIG. 1). It should be noted that the heat pipe cooling system 100 may use a suitable saddle 118 that matches the geometric shape of the heat-generating device (not shown) to transfer the heat Q uniformly to the evaporator 110. In addition, the connecting pipeline 120 of the heat pipe cooling system 100 may be suitably bent according to the actual requirements so that the heat pipe cooling system 100 can have a more flexible outward appearance.

Figure 7:
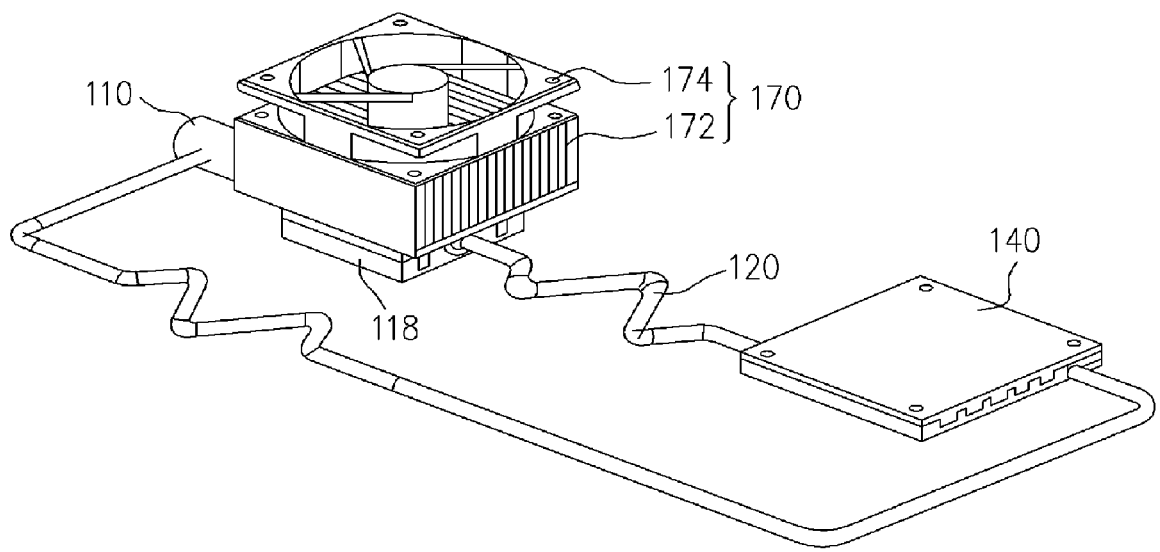
FIG. 7 is a rough sketch showing the external appearance of the heat pipe cooling system according to another embodiment of the present invention.

FIG. 7 is a rough sketch showing the external appearance of the heat pipe cooling system according to another embodiment of the present invention. Heat pipe cooling system 100 may further comprises a cooling module 170. The cooling module 170 comprises a plurality of cooling fins 172 and a fan 174 wherein the fan 174 is mounted on the cooling fins 172. Therefore, the size of the thermal connector 140 and the air flow of the fan 174 can be flexibly adjusted such that the cooling performance of the heat pipe cooling system 100 can be optimized.

Figure 8:
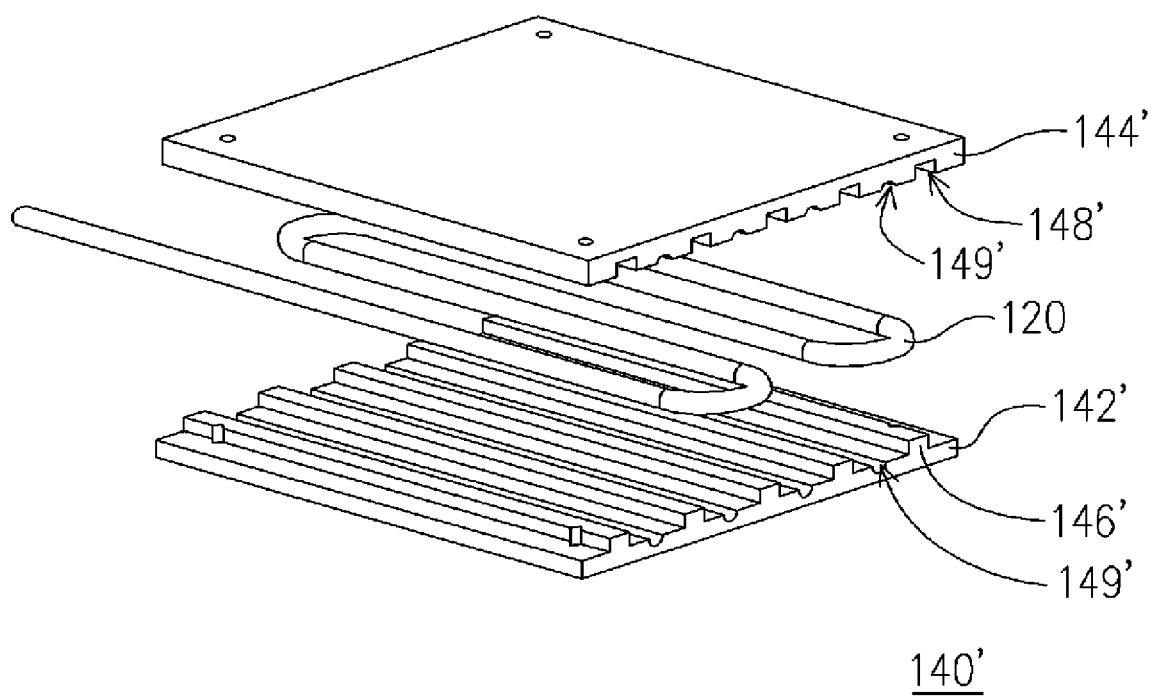
FIG. 8 is an explosion view of the components of the thermal connector according to another embodiment of the present invention.
Figure 9:
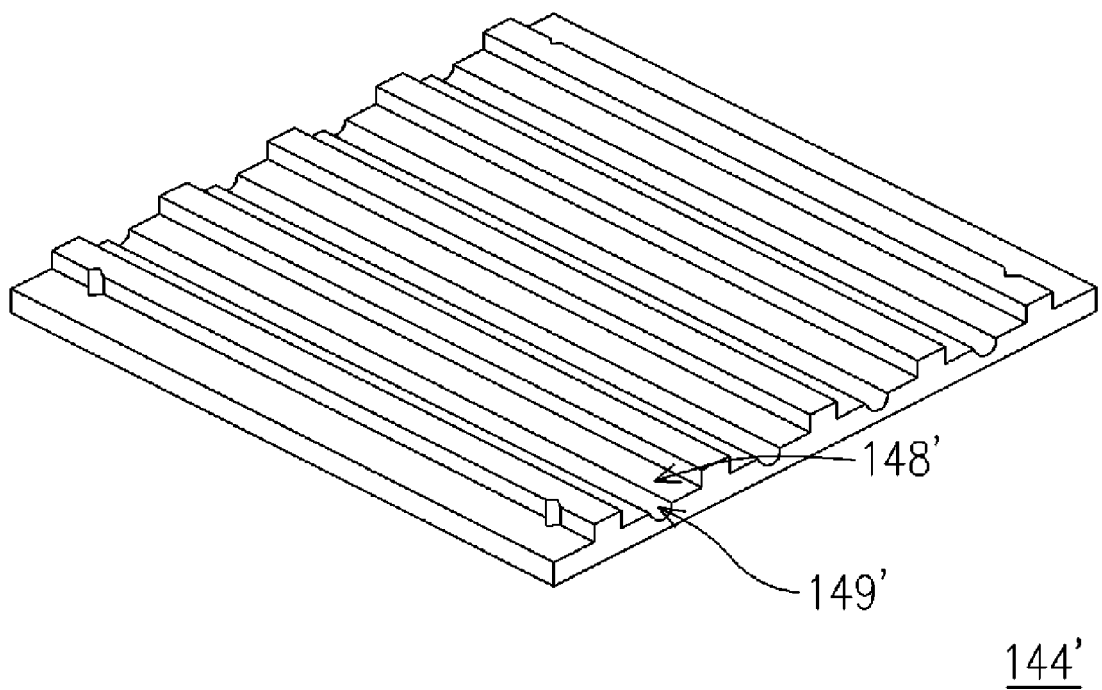
FIG. 9 is a perspective view of the second thermal conductive block in FIG. 8.

FIG. 8 is an explosion view of the components of the thermal connector according to another embodiment of the present invention. FIG. 9 is a perspective view of the second thermal conductive block in FIG. 8. As shown in FIGS. 4, 8 and 9, the first thermal conductive block 142' can have a plurality of second fitting parts 146' with a spine design, and the second thermal conductive block 144' can have a plurality of second fitting parts 148' with a groove design. Hence, straight piping channels 149' are formed inside the thermal connector 140' to accommodate a portion of the connecting pipeline 120 snugly.

Figure 10:
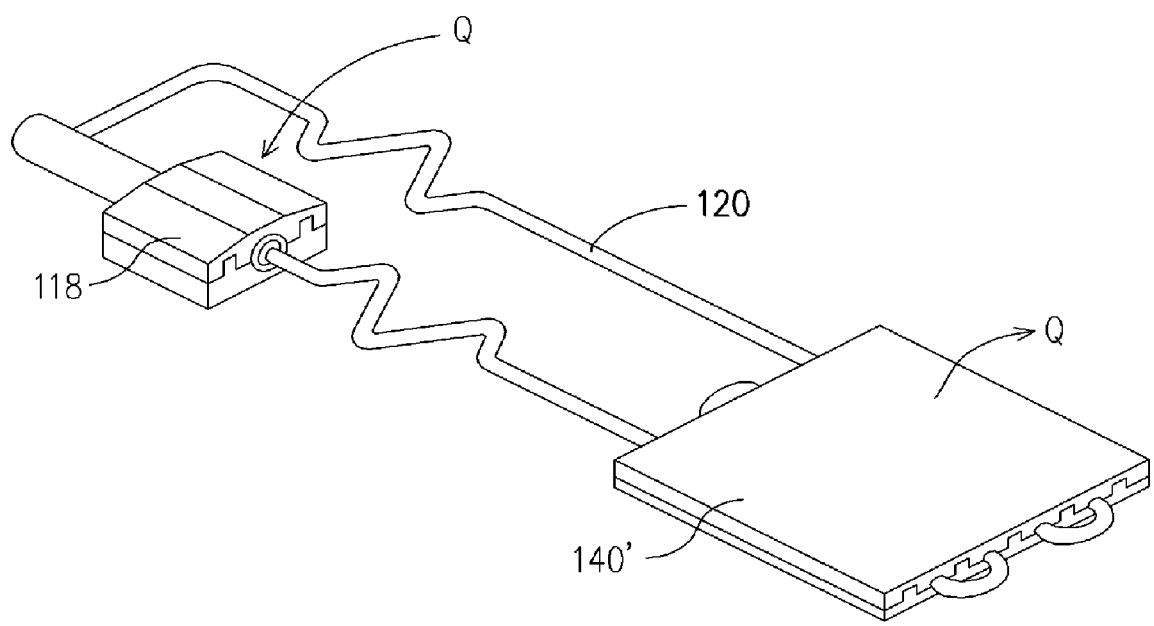
FIG. 10 is a rough sketch showing the external appearance of a heat pipe cooling system according to another embodiment of the present invention that uses the thermal connector shown in FIG. 8.

FIG. 10 is a rough sketch showing the external appearance of a heat pipe cooling system according to another embodiment of the present invention that uses the thermal connector shown in FIG. 8. As shown in FIGS. 8 and 10, when a portion of the connecting pipeline 120 is disposed inside the thermal connector 140', the piping channel 149 encloses the portion of the connecting pipeline 120. Thus, the heat Q within the gaseous working fluid 130 inside the connecting pipeline 120 can be transferred to the thermal connector 140 through the wall of the connecting pipeline 120 and then carried away to the object 160 (see FIG. 1).

Figure 11:
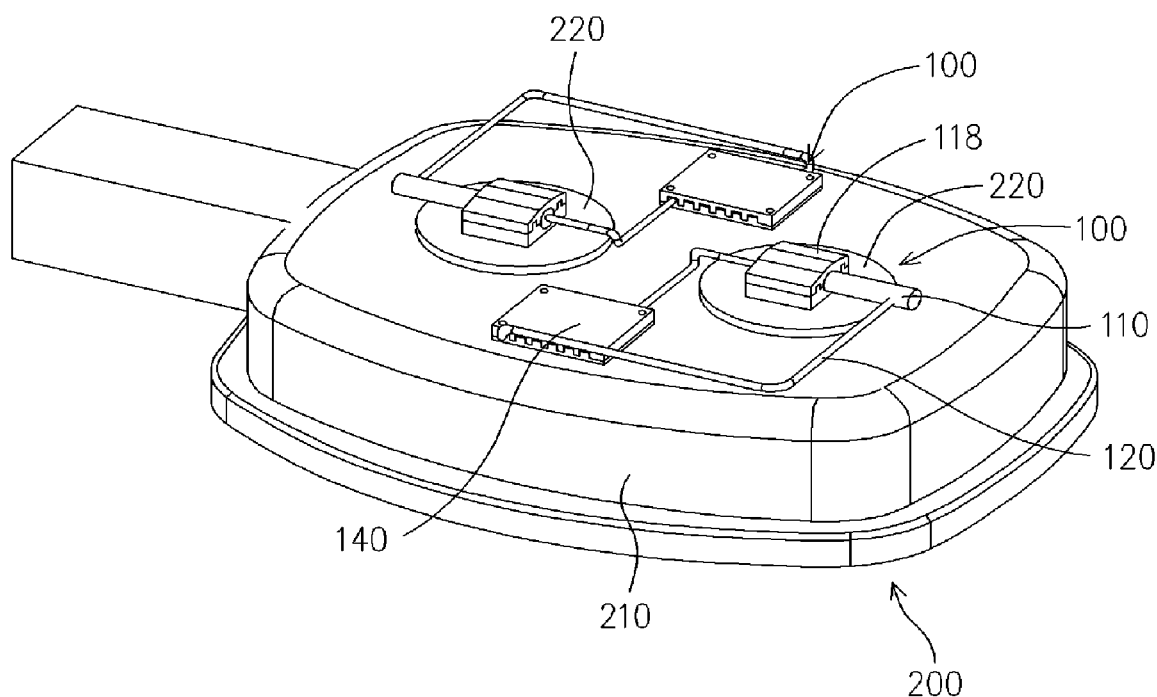
FIG. 11 is a perspective view of a light-emitting diode streetlight using the heat pipe cooling system shown in FIG. 6.

FIG. 11 is a perspective view of a light-emitting diode streetlight using the heat pipe cooling system shown in FIG. 6. The light-emitting diode streetlight has great potential for public illumination. If the present invention is applied to this type of illumination equipment, the energy cost for installing a cooling system can be significantly reduced. As shown in FIG. 11, the evaporator 110 of the heat pipe cooling system 100 is mounted on the light-emitting diode light source 220 of the light-emitting diode streetlight 200 through a saddle 118. The thermal connector 140 is detachably mounted on a metallic casing 210 using a set of screws or through magnetic force of attraction. Furthermore, a thermal conductive layer such as a layer of thermal conductive paste or a thermal conductive pad is set up between the thermal connector 140 and the metallic casing 210. Consequently, the metallic casing 210 can be utilized as a condenser of the heat pipe cooling system 100 to remove the heat produced by the light-emitting diode light source 220 through natural convection with the surroundings. Since the heat pipe cooling system 100 is a passive thermal conductive device, there is no need to provide additional energy for transferring the heat from the light-emitting diode light source 220 to the surface of the metallic casing 210. The heat can be effectively removed through the available surface area of the metallic casing 210 to the surroundings. Therefore, for the light-emitting diode streetlight 200 that needs to operate for a very long period of time, the heat pipe cooling system 100 of the present invention saves a lot of energy.

Figure 12:
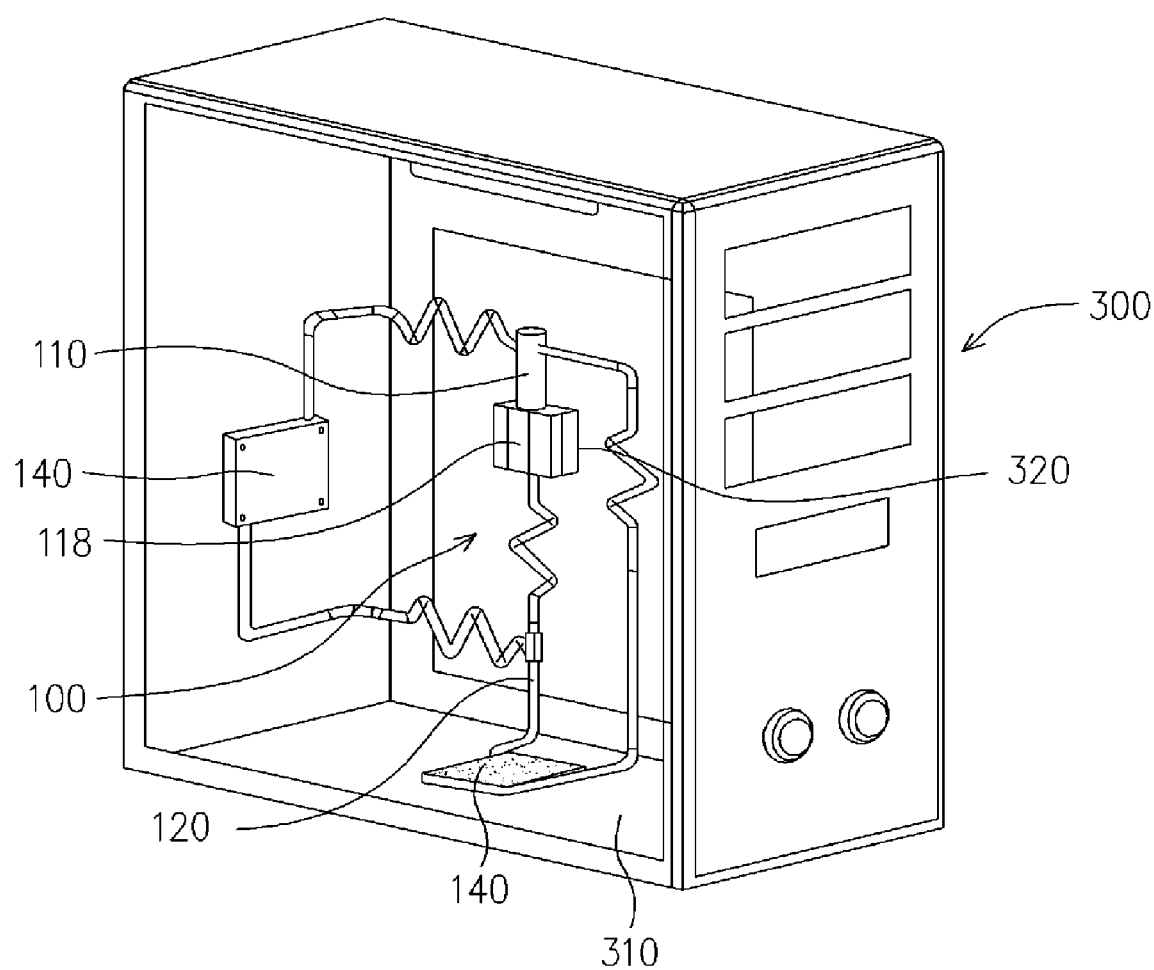
FIG. 12 is a perspective view of a desktop computer using the heat pipe cooling system shown in FIG. 6.

FIG. 12 is a perspective view of a desktop computer using the heat pipe cooling system shown in FIG. 6. As shown in FIG. 12, the evaporator 110 of the heat pipe cooling system 100 is mounted on a heat-generating device 320 inside a desktop computer 300 through a saddle 118. The heat-generating device 320 is a central processing unit (CPU), a graphic chip or other chip that generates large quantity of heat, for example. The thermal connector 140 is attached to the casing 310 of the desktop computer 300 using a detachable connection such as a set of screws or magnetic force of attraction. Since the thermal connector 140 is attached to a casing 310 fabricated from a metallic material such as aluminum alloy, the entire casing 310 will become the condenser of the heat pipe cooling system 100. In other words, the heat produced by the heat-generating device can be removed from the desktop computer 300 through the casing 310.

Figure 13:
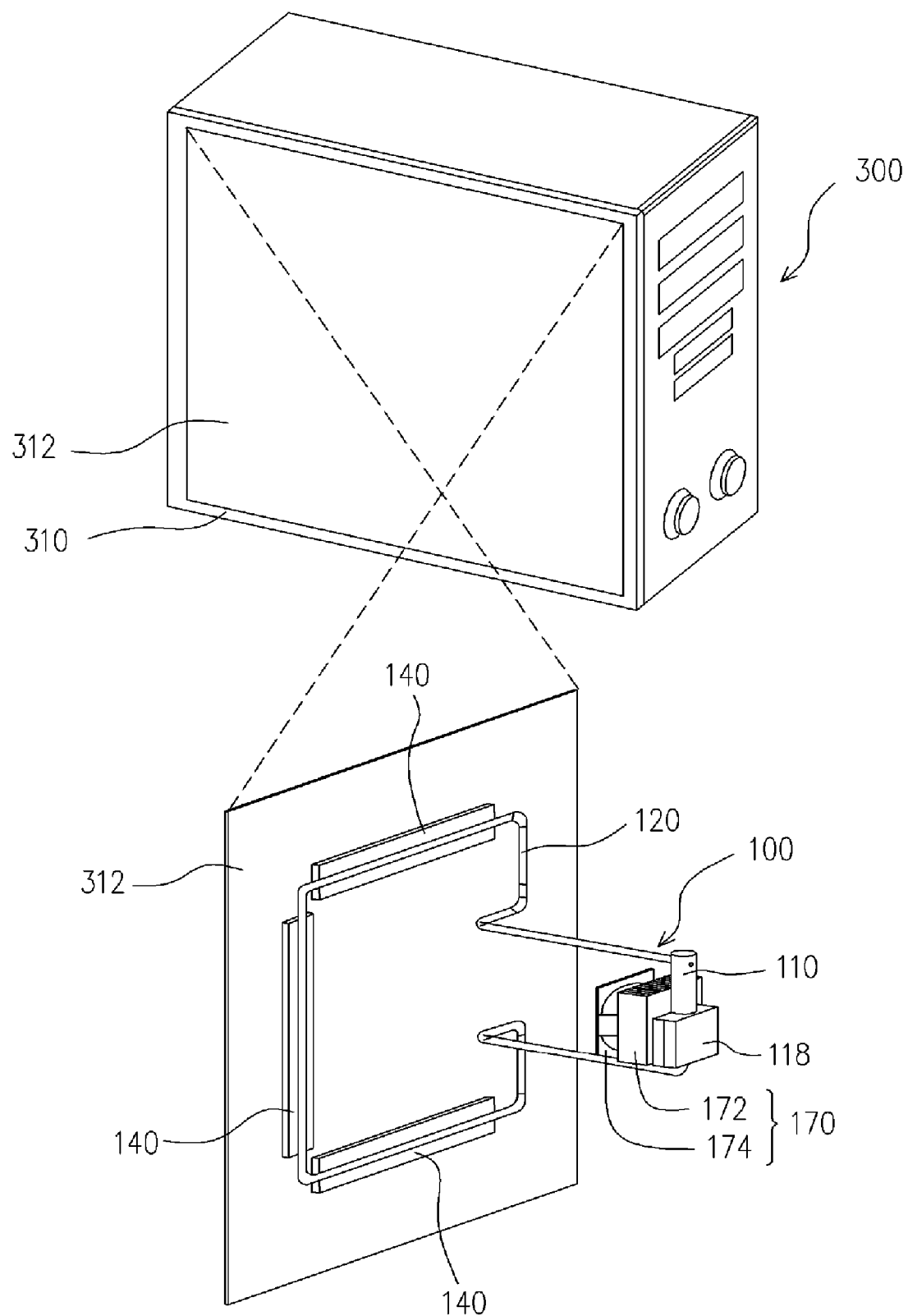
FIG. 13 is a perspective view of a desktop computer using the heat pipe cooling system shown in FIG. 7.

FIG. 13 is a perspective view of a desktop computer using the heat pipe cooling system shown in FIG. 7. As shown in FIG. 13, the heat pipe cooling system 100 with the cooling module 170 shown in FIG. 7 is installed in a desktop computer 300. The heat pipe cooling system 100 has a plurality of thermal connector 140 disposed on a side plate 312 of a casing 310 of the desktop computer 300, and utilizes the side plate 312 to be a condenser thereof.

In summary, the thermal conductive block in the present invention can transfer the heat from a heat-generating device to an object attached to the thermal conductive block and using the object as a condenser of the heat pipe cooling system. Thus, the heat pipe cooling system of the present invention can remove heat from a heat-generating device with very little expenditure of energy cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thermal connector for connecting a connecting pipeline of a heat pipe cooling system with an object that serves as a condenser of the heat pipe cooling system, the thermal connector comprising:

a first thermal conductive block having a plurality of first fitting parts and a contact surface, wherein the contact surface is attached to one of the surfaces of the object; and a second thermal conductive block having a plurality of second fitting parts, wherein the second fitting parts mesh with the first fitting parts, one of each of the first fitting parts and each of the second fitting parts is a spine, the other one of each of the first fitting parts and each of the second fitting parts is a groove corresponding to the spine, the grooves communicate with each other through a plurality of trenches passing across at least two adjacent grooves, the depth of each of the grooves is greater than the height of each of the spines, each of the grooves and the corresponding spine form a space between the top of the spine and the bottom of the groove, and side walls of each of the spines parallel to the grooves touch side walls of the corresponding groove except in the region where the depth of the groove is greater than the height of the spine, so as to be fluidly tight;

wherein the first thermal conductive block and the second thermal conductive block together form a network piping channel suitable for accommodating a section of the connecting pipeline when the second fitting parts and the first fitting parts are fitted together, the trenches and the spaces together form the network piping channel, the network piping channel comprises a plurality of first channels and a plurality of second channels, the trenches form the first channels, the spaces form the second channels, the extending direction of the first channels is different from the extending direction of the second channels, and the surface seams formed after assembling the first thermal conductive block and the second thermal conductive block together are sealed using soldering material.

2. The thermal connector of claim 1, wherein the piping channel encloses the section of connecting pipeline tightly when a section of the connecting pipeline is accommodated inside the piping channel.

3. The thermal connector of claim 1, wherein the assembled first thermal conductive block and the second thermal conductive block is detachably joined to the object such that the contact surface of the first thermal conductive block is attached to the surface of the object.

4. The thermal connector of claim 3, wherein the assembled first thermal conductive block and the second thermal conductive block is joined to the object using a set of screws such that the contact surface of the first thermal conductive block is attached to the surface of the object.

5. The thermal connector of claim 3, wherein the assembled first thermal conductive block and the second thermal conductive block is attached to the object through magnetic force of attraction such that the contact surface of the first thermal conductive block is attached to the surface of the object.

6. A heat pipe cooling system for transferring the heat produced by a heat-generating device to an object that serves as a condenser, the heat pipe cooling system comprising:

an evaporator connected to the heat-generating device;

a connecting pipeline connected to the evaporator;

a working fluid injected into a closed loop formed by the evaporator and the connecting pipeline; and a thermal connector, having:

a first thermal conductive block having a plurality of first fitting parts and a contact surface, wherein the contact surface is attached to one of the surfaces of the object; and a second thermal conductive block having a plurality of second fitting parts, wherein the second fitting parts mesh with the first fitting parts, one of each of the first fitting parts and each of the second fitting parts is a spine, the other one of each of the first fitting parts and each of the second fitting parts is a groove corresponding to the spine, the grooves communicate with each other through a plurality of trenches passing across at least two adjacent grooves, the depth of each of the grooves is greater than the height of each of the spines, each of the grooves and the corresponding spine form a space between the top of the spine and the bottom of the groove, and side walls of each of the spines parallel to the grooves touch against side walls of the corresponding groove except in the region where the depth of the groove is greater than the height of the spine, so as to be fluidly tight;

wherein the first thermal conductive block and the second thermal conductive block together form a network piping channel suitable for accommodating a section of the connecting pipeline when the second fitting parts and the first fitting parts are fitted together, the trenches and the spaces together form the network piping channel, the network piping channel comprises a plurality of first channels and a plurality of second channels, the trenches form the first channels, the spaces form the second channels, the extending direction of the first channels is different from the extending direction of the second channels, and the surface seams formed after assembling the first thermal conductive block and the second thermal conductive block together are sealed using soldering material.

7. The heat pipe cooling system of claim 6, wherein the piping channel encloses the section of connecting pipeline tightly when a section of the connecting pipeline is accommodated inside the piping channel.

8. The heat pipe cooling system of claim 6, wherein the assembled first thermal conductive block and the second thermal conductive block is detachably joined to the object such that the contact surface of the first thermal conductive block is attached to the surface of the object.

9. The heat pipe cooling system of claim 8, wherein the assembled first thermal conductive block and the second thermal conductive block is joined to the object using a set of screws such that the contact surface of the first thermal conductive block is attached to the surface of the object.

10. The heat pipe cooling system of claim 8, wherein the assembled first thermal conductive block and the second thennal conductive block is attached to the object through magnetic force of attraction such that the contact surface of the first thermal conductive block is attached to the surface of the object.

11. The heat pipe cooling system of claim 6, further comprising a cooling module connected to the evaporator.

12. The heat pipe cooling system of claim 11, wherein the cooling system further comprising:

a plurality of fins connected to the thermal connector; and a fan disposed on the fins.

* * * * *